United States Patent [19]

Ayata

[11] Patent Number: 4,641,257

[45] Date of Patent: Feb. 3, 1987

[54] MEASUREMENT METHOD AND APPARATUS FOR ALIGNMENT

[75] Inventor: Naoki Ayata, Machida, Japan

[73] Assignee: Canon Kabushiki Kaisha, Japan

[21] Appl. No.: 626,990

[22] Filed: Jul. 2, 1984

[30] Foreign Application Priority Data

Jul. 7, 1983 [JP] Japan ................... 58-122342
Jul. 7, 1983 [JP] Japan ................... 58-122345

[51] Int. Cl.$^4$ ................. G01B 11/00; H04N 7/18
[52] U.S. Cl. .................... 364/559; 356/400; 358/100
[58] Field of Search ............... 364/559, 491; 356/400, 356/401, 399; 358/100, 101

[56] References Cited

U.S. PATENT DOCUMENTS

| | | | |
|---|---|---|---|
| 4,203,132 | 5/1980 | Schmitt et al. | 364/559 X |
| 4,292,576 | 9/1981 | Watts | 356/400 X |
| 4,342,090 | 7/1982 | Caccoma et al. | 364/491 |
| 4,408,885 | 10/1983 | Johannsmeir et al. | 356/401 |
| 4,413,186 | 11/1983 | Uema | 364/559 X |
| 4,504,148 | 3/1985 | Kuroki et al. | 356/401 |
| 4,515,481 | 5/1985 | Yamada et al. | 356/401 X |
| 4,545,684 | 10/1985 | Kuroki et al. | 356/401 X |
| 4,553,845 | 11/1985 | Kuroki et al. | 356/400 |

Primary Examiner—Felix D. Gruber
Assistant Examiner—Joseph L. Dixon
Attorney, Agent, or Firm—Fitzpatrick, Cella, Harper & Scinto

[57] ABSTRACT

A measurement apparatus, includes a detector for detecting marks of plural objects to produce a series of signals; a peak detector for detecting peak values of the signals; a device for determining a slice level for each of the peak values detected by the peak detector; and a comparator for sequentially comparing the signals with respective slice levels determined by the slice level determining device and determining an interval between the marks on the basis of the comparison.

3 Claims, 13 Drawing Figures

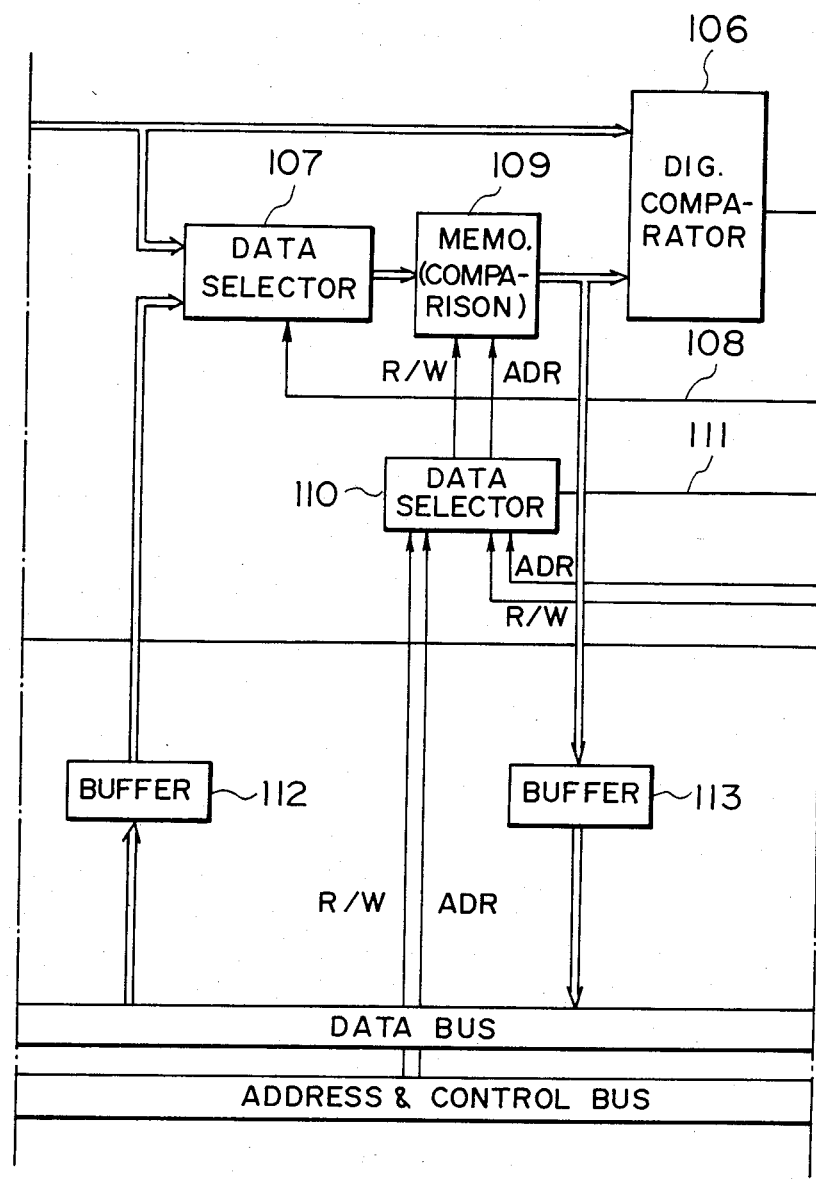
F I G. 4B

MEASUREMENT METHOD AND APPARATUS FOR ALIGNMENT

BACKGROUND OF THE INVENTION

The present invention relates to measurement method and apparatus for aligning two objects. More particularly, the present invention relates to a detection of an alignment mark on a mask or reticle or of an alignment mark on a wafer prior to aligning a semiconductor circuit pattern on a reticle or a mask with a wafer.

Semiconductor circuit manufacturing includes the steps of sequentially printing several patterns on a wafer to form an integrated semiconductor circuits. Those steps require that the wafer and the mask bearing a pattern are aligned with each other with a high precision so as to correctly align a pattern of a mask to the pattern which has been printed on the wafer in the previous step or steps. Prior to the alignment operation, alignment marks formed on the mask and the wafer are photoelectrically detected to determine a relative positional relation therebetween, and then a relative movement between the mask and the wafer is made on the basis of the positional determination.

The alignment mark of the mask or wafer is detected by a signal produced by the mark being at a peak level which is over a predetermined reference level. Heretofore, the reference level has been fixed so that it may be too high or low depending on the kind of the wafer or the mask being processed. Those improper reference levels may result in failure of the detection of the alignment marks. It is known that, when the detection fails, the reference level is manually changed.

SUMMARY OF THE INVENTION

It is a principal object of the present invention to provide measurement method and apparatus wherein each of the marks can be clearly detected irrespective of the optical properties of the members on which the marks are formed.

It is a second object of the present invention to provide measurement method and apparatus wherein each of the marks can be detected with a high precision irrespective of the magnitude of each of them.

It is a third object of the present invention to provide measurement method and apparatus wherein a slice level is determined for each of the signals in accordance with the magnitude of each of them.

It is a fourth object of the present invention to provide measurement method and apparatus wherein an interval between plural marks disposed on substantially the same surfaces, such as the surfaces placed in close proximity with each other and optically conjugate surfaces.

It is a fifth object of the present invention to provide measurement method and apparatus wherein marks provided on two objects, such as a mask and a wafer are detected, and the misalignment therebetween is determined, and then the two objects are moved, relative to the other, into alignment in accordance with the determination.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A–4C are segments of a block diagram of a position detecting circuit used with the embodiment of the present invention.

DESCRIPTION OF THE PREFERRED EMBODIMENTS

The preferred embodiments of the present invention will be described in conjunction with the accompanying drawings.

Figure 1:
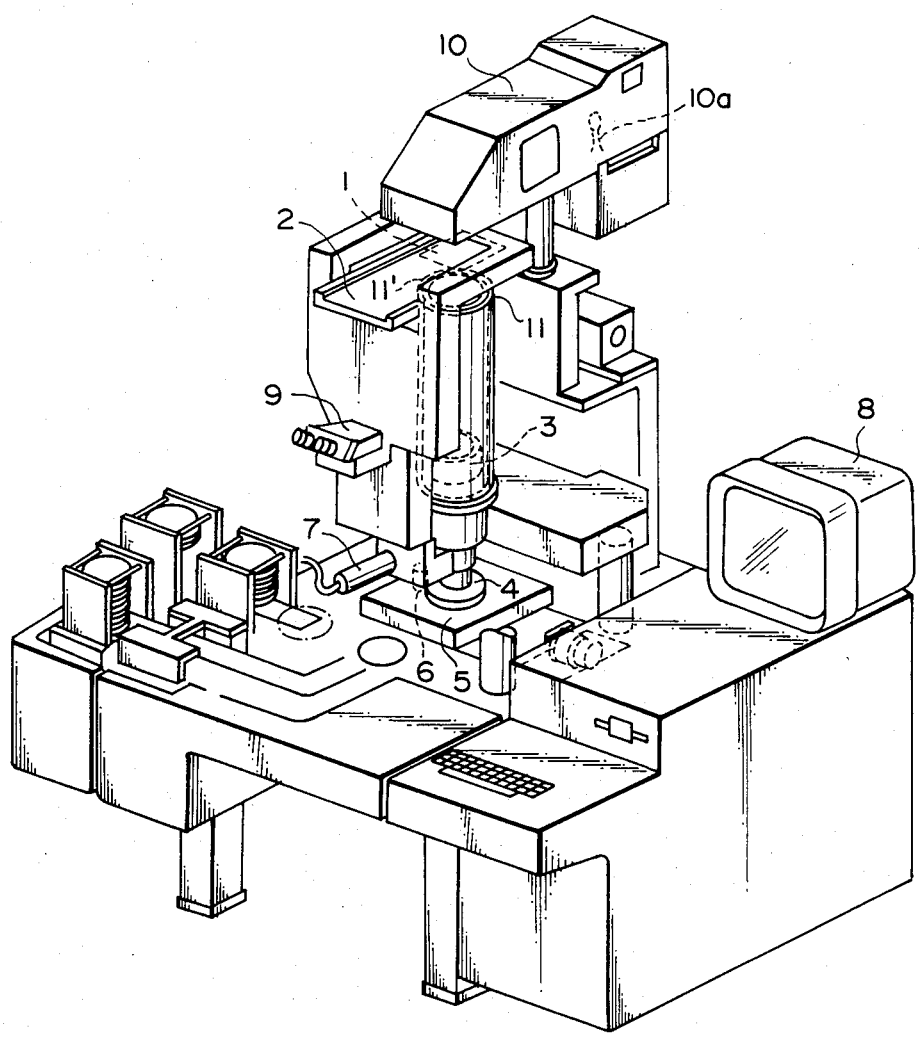
FIG. 1 is a perspective view of a stepper, that is, a step-and-repeat type mask aligner to which the present invention is used.

In FIG. 1 there is shown an alignment and exposure device provided with a position detecting circuit according to an embodiment of the present invention. A mask 1 having an integrated circuit pattern, mask alignment mark and mask-wafer alignment marks, is held on a mask stage 2 which supports the mask 1 and translates and rotates in a plane. The pattern of the mask 1 is optically projected through a reduction projection lens 3 onto a wafer 4 having a photosensitive layer, mask-wafer alignment marks and wafer alignment marks. The wafer 4 is supported on a wafer stage 5 which supports the wafer 4 and translates and rotates it in a plane. Also, the wafer stage 5 is movable between an exposure position which is within a projection field of the reduction projection lens 3 and a TV wafer alignment station. The TV wafer alignment station comprises a detection objective lens 6, an image pick-up tube or a solid-state image pick-up element and a TV display 8 for observation. For an additional observation facility, there is provided a binocular unit 9 which allows observation of the surface of the wafer 4 through the projection lens 3. The alignment and exposure apparatus further includes an upper unit 10 which contains an illumination optical system for converging the mask illumination light produced by a light source 10a and a detection system for aligning the mask 1 and the wafer 4. The wafer stage 5 receives at a predetermined position a wafer fed by wafer feeding means not shown and conveys the wafer 4 to the TV wafer alignment station so that the alignment mark on the wafer is placed within the field of view of the objective lens 6. The accuracy of the positioning at this step is dependent on the accuracy of a mechanical alignment, and the view field of the objective lens 6 is approx. 1–2 mm in diameter. The alignment mark in this view field is detected by the image pick-up tube 7, and the position thereof is determined on coordinates with its original of a TV wafer alignment reference mark provided within an optical system for the TV wafer alignment, which will be described hereinafter. A distance between the TV wafer alignment reference mark and an automatic alignment detection position in the field of the projection optical system is precisely predetermined, so that the distance through which the wafer is moved from the TV wafer alignment station to the automatic alignment position is determined in accordance with the coordinate position of the TV wafer alignment mark.

The error in the position detection by the TV wafer alignment station is not more than plus or minus 5 microns. The total error including the error which may occur during the wafer stage movement from the TV wafer alignment station to the mask-wafer alignment station, is on the order of plus or minus 10 microns. Therefore, the fine alignment operation in the mask-wafer alignment station is required to be executed only within the range of approx. plus or minus 10 microns, which is less than 1-100 of the view field of a conventional alignment system. This makes it possible to effect the alignment operation at a higher speed than in conventional systems.

Figure 2:
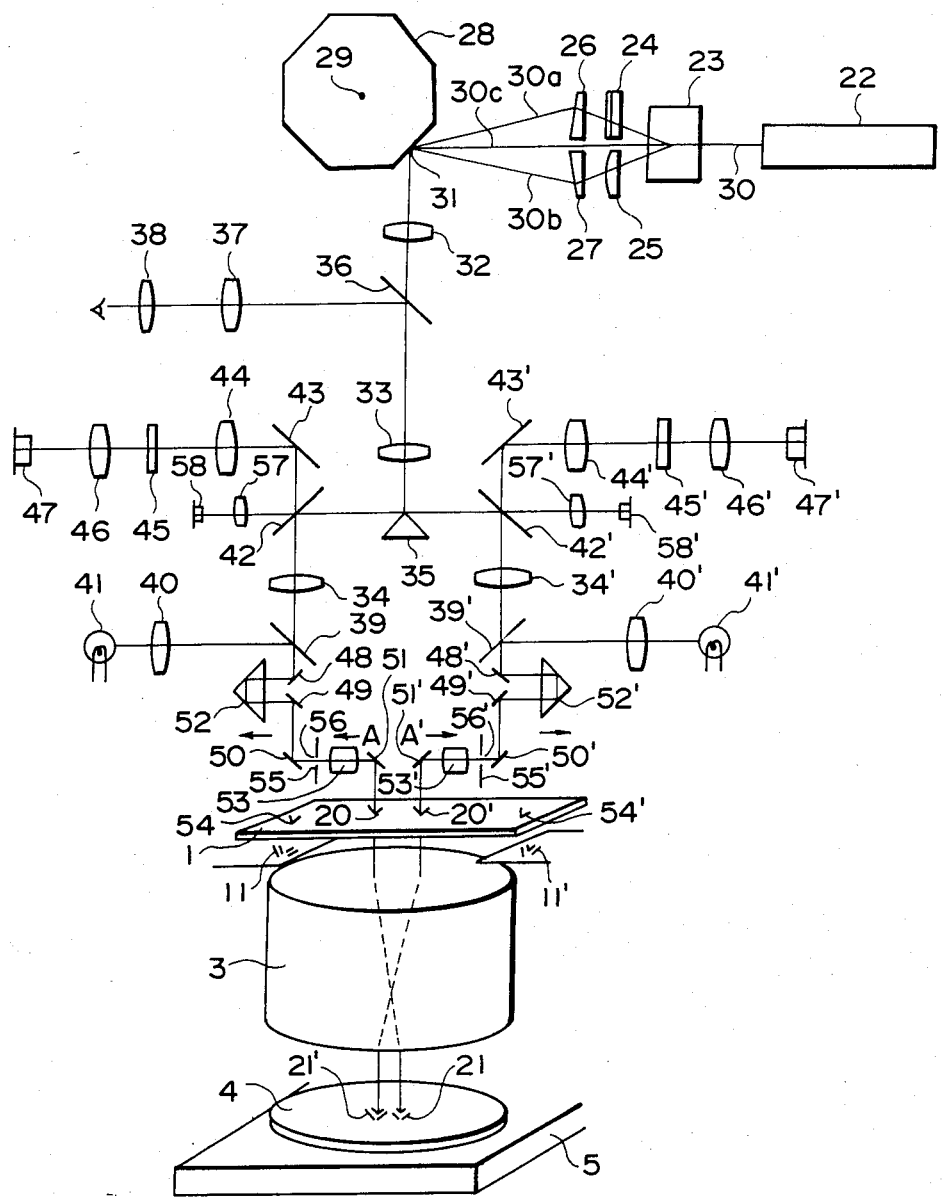
FIG. 2 illustrates an optical arrangement used in an alignment apparatus according to an embodiment of the present invention.

FIG. 2 illustrates an optical system for the alignment and exposure apparatus according to the embodiment of the present invention and shows the state of the optical system when it produces detection signals representative of the alignment marks on the mask 1 and wafer 4. The shown mask 1, reduction projection lens 3, wafer 4 and wafer stage 5 correspond to those elements shown in FIG. 1. The projection lens 3 is schematically shown for the sake of simplicity of explanation. Mask alignment marks 11 and 11' are formed at fixed positions, for example, on a lens barrel or a part of a frame of the apparatus.

Figure 3A:
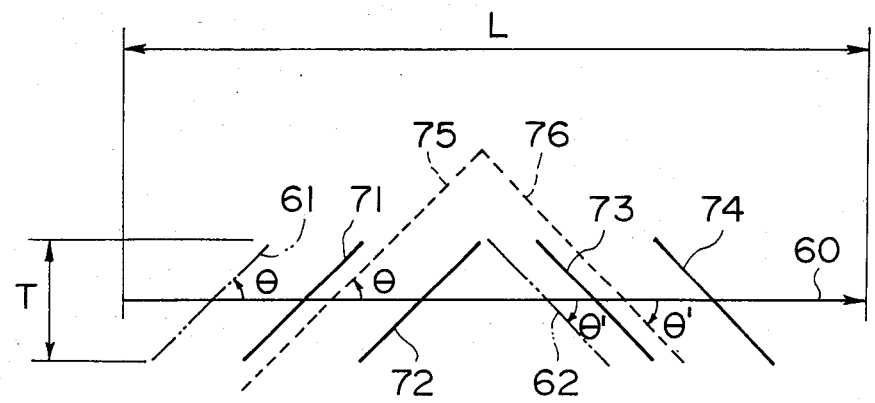
FIG. 3A illustrates an example of a set of alignment marks on a mask and a wafer used with an apparatus according to the embodiment of the present invention.

The mask 1 has at each of the positions shown by reference numerals 20 and 20' an alignment mark which is in the form of lines or slits 75 and 76 at an angle of 45 degrees with respect to a scanning line 60, as shown in FIG. 3A. Correspondingly, the wafer 4 has at each of the positions shown by reference numerals 21 and 21' an alignment mark which is in the form of lines or slits 71, 72, 73 and 74 extending at an angle of 45 degrees with respect to the scanning line 60 as shown in FIG. 3A. Usually the positional alignment is effected based on the signals provided by both of the left-hand and right-hand optical systems.

The alignment marks on the mask 1 and wafer 4, when a projection optical system which is not a unit magnification projection optical system is provided therebetween, are dimensioned such that one has the same size as the other when the one is projected therethrough to the other, whether the projection is in one direction or the other through the projection lens. Since, in this embodiment, a reduction projection lens 3 is employed, the value obtained by dividing the dimension of the mask alignment mark by that of the wafer alignment mark is equal to the magnification (reduction) of the reduction projection lens 3.

Referring back to FIG. 2, the optical system includes a laser generating source 22 and a beam deflector in the form of an acoustooptic element or the like. The beam deflector 23 serves to change the direction of the beam horizontally and vertically in response to external changing signals. The beam is then passed through converging cylindrical lenses 24 and 25 which are so arranged that the generating lines thereof are orthogonal. The cylindrical lenses 24 and 25 are effective to convert the cross-section of the laser beam into a linear cross-section. After the cylindrical lens 24 and 25, there are provided trapezoidal prisms 26 and 27, which serve to refract the beam which has been vertically deflected by the beam deflector 23. There is further provided a polygonal mirror 28 which is rotatable about a shaft 29.

The laser beam 30 produced by the laser beam source 22 takes one of the following three optical paths depending on the state of the beam deflector 23. The first is the path for a slit cross-section beam 30a, extending through the cylindrical lens 24 and the prism 26; the second, the path for a slit cross-section beam 30b, extending through the cylindrical lens 25 and the prism 27; and the third is the path for a spot beam 30c, extending straight. The beam, whichever path is taken by itself, converges to the same position 31 on the surface of the polygonal mirror 28. The system further comprises an $F-\theta$ lens 32, intermediate lens 33 and 34, a beam splitter mirror 35 for dividing the optical path, a half-mirror 36 which directs the beam to observation optical systems 37 and 38, a lens 37, and an eye piece 38 for forming an image of the wafer 4 surface at the infinite distance. A half-mirror 39 serves to introduce light for observation from an observation illumination system comprising a lamp 41 and a condenser lens 40. Another half-mirror 42 is provided to direct the beam to a photoelectric detection system including a mirror 43, a lens 44, a spatial frequency filter 45 and a condenser lens 46. It further includes a photodetector 47 for detecting a signal representative of an alignment pattern, a lens 57 and a photodetector 58 for detecting a synchronization signal. There are provided further full-reflection mirrors 48, 49, 50 and 51, a prism 52 and a microscopic objective lens 53. The mask 1 is provided with a mask alignment pattern 54.

The foregoing explanation of FIG. 2 has been made only with respect to the left-hand part of the optical system, since the right-hand part is symmetric. The explanation thereof will be omitted for the sake of simplicity by giving the same reference numerals but with primes to the corresponding elements.

The $f-\theta$ lens 32 and the intermediate lenses 33 and 34 are arranged such that an image of the origin of the deflection by the polygonal mirror 28 is formed at the pupil 56 in the stop 55 of the objective lens 53. Therefore, the laser beam scans the mask 1 and wafer 4 in accordance with rotation of the polygonal mirror.

In the objective lens optical system, the objective lens 53, the stop 55, mirror 51 and prism 52 are movable in the directions of X and Y by an unshown moving means so that the position of observation or measurement for the mask 1 and wafer 4 can be changed. For example, during the movement in X direction, when the mirror 51 moves in the direction shown by arrow A, the objective lens 53 and the stop 55 also move in the direction of arrow A, while the prism 52 also moves in the same direction but angly one half of the movement of the mirror 51 to keep the optical path length constant at all times. During the movement in Y direction, on the other hand, the entire observation and position detection optical system moves in Y direction (perpendicular to the sheet of drawing).

Figure 3B:
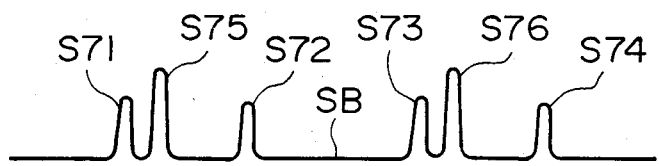
FIG. 3B shows a detection signal corresponding to the alignment mark of FIG. 3A.

The scanning beam 61 which has passed along the optical path 30a through the cylindrical lens 24, is incident to form an illumination area in the form of a line extending at an angle of 45 degrees with respect to the scanning line 60, that is, extending parallel to the marks 71, 72 and 75 shown in FIG. 3A. Upon the scanning operation with this beam, signals S71, S75 and S72 are produced by the photodetectors 47 and 47', as shown in FIG. 3B. Those resultant signals S71, S75 and S72 correspond to the marks 71, 75 and 72, respectively. Even if there is a fine piece of dust on the surface being scanned, the influence thereof is much smaller than when it is scanned with spot-like beam, so that the dust is practically not detected.

On the other hand, the scanning beam 62 which has passed along the optical path 30b through the cylindrical lens 25 is incident to form an illumination line extending at an angle of −45 degrees ($\theta$) with respect to the scanning line 60, so that it is parallel to the marks 73, 74 and 76. The detection signals are as shown in FIG. 3B by reference numerals S73, S76 and S74. The positional deviation or displacement between the mask 1 and wafer 4 can be determined by measuring the intervals between the detection signals S71, S75, S72, S73, S76 and S74. When they are correctly aligned, the intervals are equal.

It is added here that U.S. Pat. Nos. 4,167,677 and 4,199,219 which have been assigned to the assignee of the present application propose automatic alignment systems.

In the foregoing paragraphs, an alignment between the alignment mark 20 on the mask 1 and the alignment mark 21 on the wafer 4 has briefly be explained together with FIGS. 2, 3A, 3B and 3C.

Figure 3C:
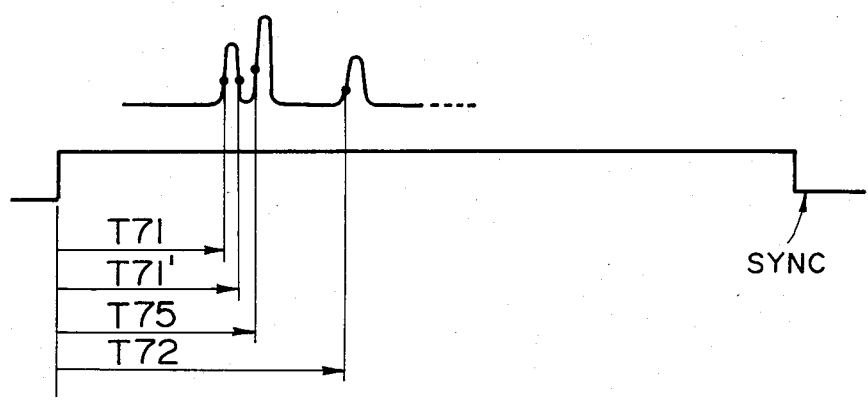
FIG. 3C shows a synchronization signal which is an output of a synchronization detecting circuit.
Figure 4A:
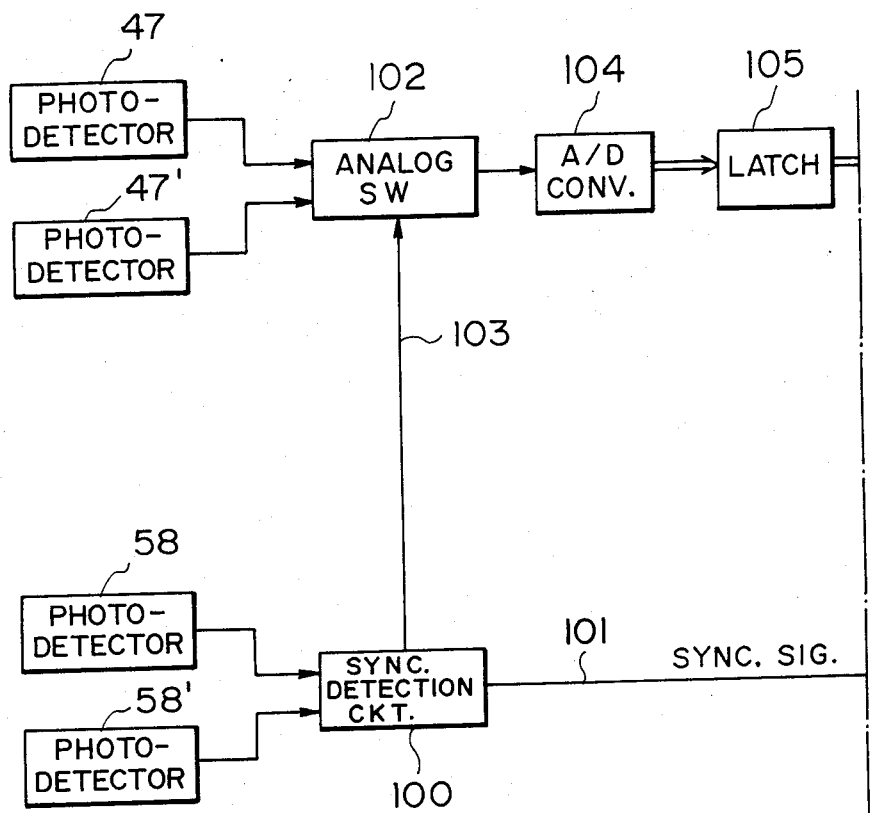
Figure 4:
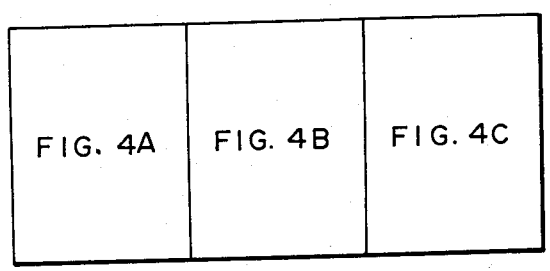
FIG. 4 shows how to juxtapose FIGS. 4A–4C to form the block diagram.
Figure 4C:
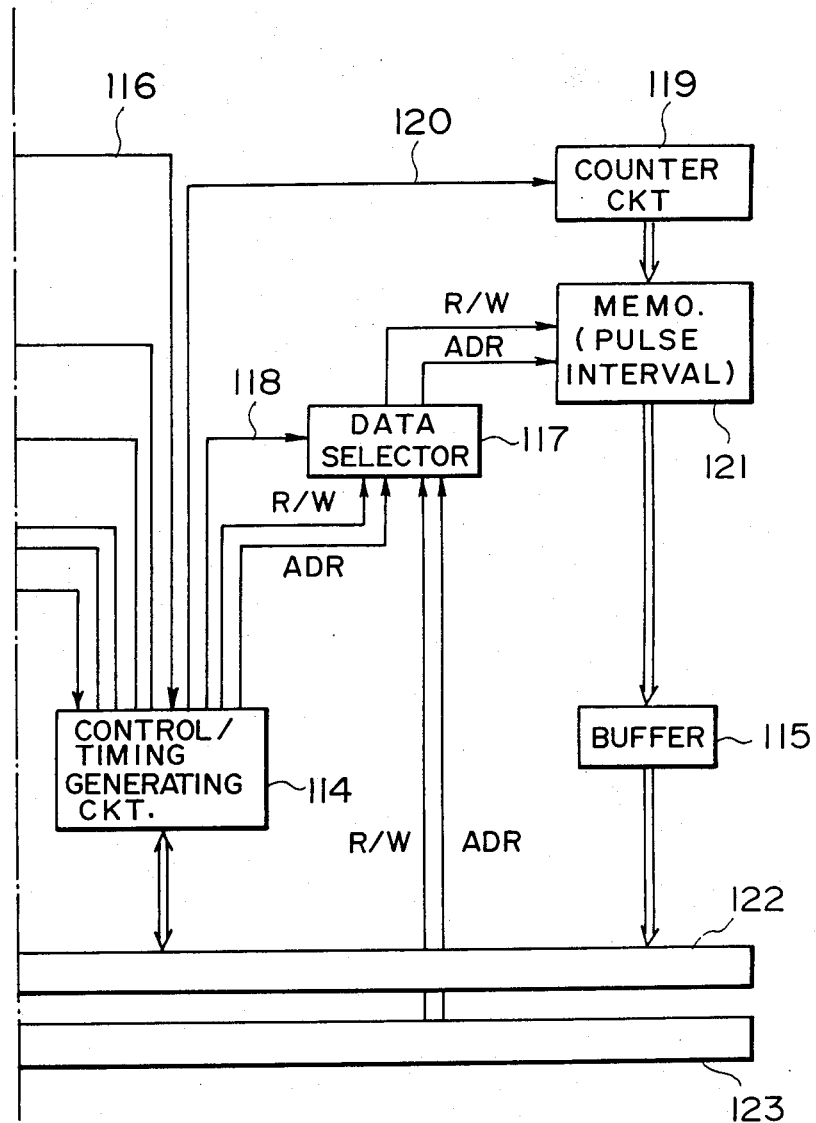

Next, the explanation will be made with respect to an alignment mark position detecting circuit usable with an alignment and exposure apparatus according to an embodiment of the present invention. FIGS. 4A–4C make up a block diagram of the position detecting circuit according to the embodiment of the present invention. The photodetectors 47 and 47', as have been already described, serve to convert the light signal representative of the alignment mark to an electric signal. The photodetectors 58 and 58' convert, to an electric signal, the laser beam which is scanning the mask 1 and the wafer 4 to detect the timing of a scan. A synchronization detection circuit 100 functions to binarize and wave-reform the output signal of the photodetectors 58 and 58' and to produce a synchronization signal 101 and control signals 103 as shown in FIG. 3C. An analog switch 102 effects a switching operation in response to the control signal 103 and combine the output signals from the photodetectors 47 and 47' (FIG. 3B shows the output signals from the photodetector 47). An analog-digital converter 104 serves to convert the level of the analog signal of the analog switch 102 to an 8 bit length digital signal at a predetermined timing. A latch 105 temporarily stores the digital signal from the analog-digital converter 104. The A/D converter 104 and the latch 105 are controlled by timing signals (not shown) generated by a control/timing generating circuit 114 which will be described hereinafter.

A data selector 107 receives the output from a buffer 112 and the output of the latch 105 and sends out one of them in response to a selection signal 108 produced by the control/timing generating circuit 114. The buffer 112 is connected to a data bus 122 of a microprocessor not shown. Designated by reference numeral 109 is a random access memory of 8 bits and 24 bytes, which is controlled by a read/write signal (hereinafter simply called R/W signal) produced by the data selector 110 and an address signal (hereinafter called ADR signal). The random access memory 109 stores the output data of the data selector 107 at predetermined addresses and allows the data to be read out. An output signal of the data selector 110 (R/W signal and ADR signal) is either one of the output signal (R/W signal and ADR signal) of the control/timing generating circuit 114 and an output signal (R/W signal and ADR signal) of the microprocessor which is given through a address/control bus 123. The selection is made therebetween by a selection signal 111 produced by the control/timing generating circuit 114.

A digital comparator 106 compares the output data of the latch 105 and the data read out of the memory 109 and send the result of the comparison to the control/timing generating circuit 114. The control/timing generating circuit 114 controls the data selectors 107 and 110 which have been described and a data selector 117 and a counter circuit 119 which will be described hereinafter, in response to the output signal 116 of the digital comparator 106, to the synchronization signal 101 of the synchronization detection circuit 100 and to an output data signal of a microcomputer given through the data bus 122. The counter circuit 119, which is a 16 bit counter, is controlled in its counting action by a clear signal sent from the control/timing generating circuit 114 through a signal line 120 and by a count enabling signal. A random access memory 121 of 16 bits and 24 words is controlled by the output signal (R/W signal and ADR signal) of the data selector 117 so that the count of the counting circuit 119 is written in at a proper address and that the data stored therein is read out. The output signal of the data selector 117 (R/W signal and ADR signal) is either one of the output signal (R/W signal and ADR signal) of the control/timing generating circuit 114 and the output signal (R/W signal and ADR signal) of a microprocessor given through the address and control bus 123. The selection therebetween is made by a selection signal 118 produced by the control/timing generating circuit 114. The outputs of the memory 109 and the memory 121 are sent to the data bus 122 through a buffer 113 and a buffer 115. Thus, the microprocessor is able to read out the data stored in the memories.

Figure 5:
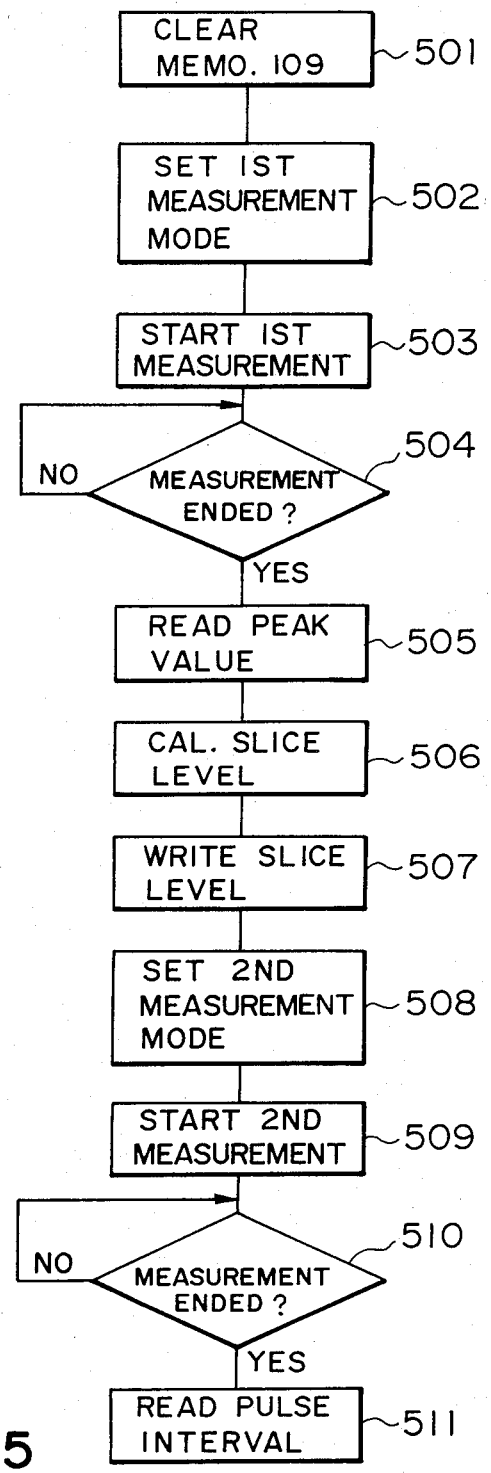
FIG. 5 is a flow chart showing a control sequence of a microprocessor for controlling the position detecting circuit of FIG. 4.
Figures 6A, 6B:
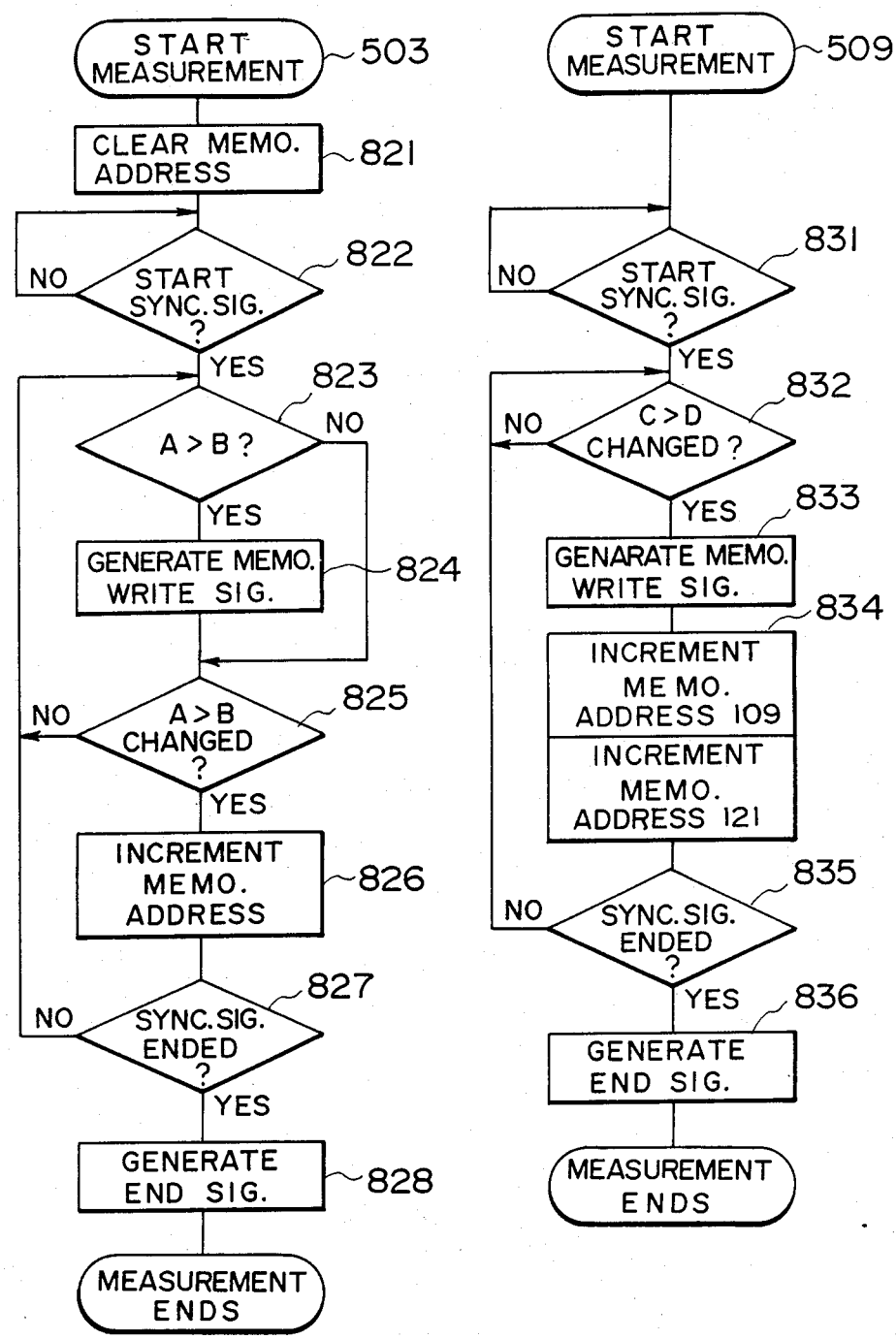
FIG. 6A is a flow chart showing further in detail an execution of a first measurement shown in FIG. 5.
FIG. 6B is a flow chart showing further in detail an execution of a second measurement shown in FIG. 5.

Operation of the position detecting circuit of the embodiment will now be described. FIG. 5 is a flow chart showing the control sequence of the microprocessor for controlling the position detecting circuit shown in FIGS. 4A–4C. FIG. 6A is a flow chart for showing in detail a part of the sequence of FIG. 5, that is, a first measurement. The first measurement is not under the control of the microprocessor but is executed by the hardware. Similarly, FIG. 6B is a flow chart showing in detail another part of the sequence shown in FIG. 5, that is, a second measurement. The second measurement is not controlled by the microprocessor but is executed by the hardware. Here, the first measurement is intended to mean the measurement for detecting a peak value of each of the peaks of the detection signals representative of the alignment marks, and the second measurement is intended to mean the measurement of the pulse intervals between the alignment mark detection signals on the basis of a reference slice level which has been determined for each of the peaks in consideration of the results of the first measurement. This will be further explained.

First, memory 109 is cleared at step 501. The microprocessor controls the system such that the control/timing generating circuit 114 applies the selection signal 111 to the data selector 110, and it applies the selection signal 108 to the data selector 107. In response thereto, the data selector 110 selects the address and conrol bus 123 of the microprocessor, and the data selector 107 selects the data bus 122 through the buffer 112. The memory 109 is directly accessed by the microprocessor so that zero is written in all storing areas of the memory 109, thus clearing it.

Then, a first measurement mode is set at step 502. The setting is accomplished by isolating the memory 109 from the control of the microprocessor and placing it under the control of the control/timing generating circuit 114. Namely, the microprocessor controls the control/timing generating circuit 114 such that the data selector 107 selects the output of the latch 105 and that the data selector 110 selects R/W signal and ADR signal of the control/timing generating circuit 114.

After the setting is completed, the microprocessor instructs the control/timing generating circuit 114 to execute the first measurement at step 503. The measurement operation is not under the control of the microprocessor but is performed by hardware, that is, under the control of the control/timing generating circuit 114. Upon the completion of the measurement, the control/timing generating circuit 114 automatically informs the microprocessor of the completion.

The operation of the first measurement under the control of the control/timing generating circuit 114 will be explained in more detail in conjunction with FIG. 6A.

Upon the first measurement starting instructions generated, an unshown address counter for the memory 109, provided in the control/timing generating circuit 114, is cleared so that the counter is set to the zero address at step 821, thus being prepared for the generation of the synchronization signal 101 (FIG. 3C) at step 822. When a leading edge of the synchronization signal is detected, the control/timing generating circuit 114 starts monitoring the output signal 116 of the digital comparator 106. If the output data of the latch 105 (hereinafter also called "A") is larger than the data read out of a predetermined address of the memory 109 (hereinafter also called "B"), that is, A>B, the control/timing generating circuit 114, in response to the output signal 116 of the digital comparator 106 showing the above result of comparison, sends R/W signals (write signal) to the memory 109. At this time, the address counter of the control/timing generating circuit 114 remains at the zero state. Therefore, the output data from the latch 105 is written in the zero address of the memory 109 (steps 823 and 824). The comparison (step 823) and the memory writing (step 824) are repeated until the state of A>B changes to A≦B. Thus, the data in the zero address are rewritten until the state change takes place. By those steps, the value or magnitude of the alignment mark signal S71, for example, is written in the zero address. When the state change to A≦B takes place, the control/timing generating circuit 114 increments by one the address counter for the memory 109 therein in response to the output signal 116 of the digital comparator 106. When the data of the next alignment mark S72 are outputted from the latch 105, the data comparison (step 823) and the memory writing (step 824) are again carried out. Those are repeated so that the peak values for all of the alignment mark signals are written in predetermined addresses of the memory 109. At step 827, a trailing edge of the synchronization signal is detected, the control/timing generating circuit 114 sends an end signal to the microprocessor. This is the end of the first measurement (step 828).

Figure 7:
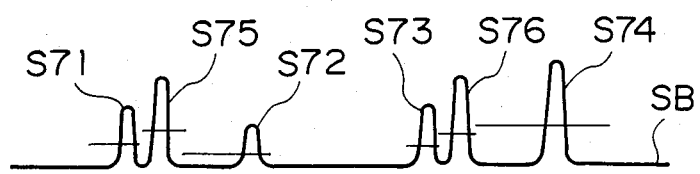
FIG. 7 illustrates slice levels determined for the respective signals.

Referring back to FIG. 5, the microprocessor then reads from the memory 109 the peak data for the respective peaks (step 505), and determines threshold levels, also referred to as slice levels, for the respective peaks, which levels are set, for example, uniformly at 30% of the respective peak data (step 506). And, it writes the slice levels in the corresponding addresses of the memory 109 (step 507). The slice levels for the respective peaks are as shown in FIG. 7. Then, the second measurement mode is set (step 508). Similarly to the first mode measurement setting, the memory 109 is isolated from the control of the microprocessor and is put under the control of the control/timing generating circuit 114. Upon the completion of the setting operation, the microprocessor instructs the control/timing generating circuit 114 to execute the second measurement instruction to start the measurement (step 509). In response to the instructions, an unshown address counter for the memory 121, which is provided in the control/timing generating circuit 114, is cleared (step 530).

The operation of the second measurement will be explained in more detail in conjunction with FIG. 6B. When the measurement start instruction signal is generated at step 509, the control/timing generating circuit 114 starts to detect the leading edge of the synchronization signal. When the leading edge is detected, the measurement operation starts.

During the second measurement operation, the slice level data stored at the respective addresses in the memory 109 are compared with the corresponding alignment mark detection signals to detect the instance when the slice level is exceeded.

The control/timing generating circuit 114, when receiving a synchronization signal 101, instructs the counter circuit 119 to count the timing clock pulses generated by the control/timing generating circuit 114. A first digital datum (C) from the first alignment mark detection signal S71 is compared with the slice level D determined for the detection signal S71 and stored in the zero address of memory 109. When the datum of signal S71 becomes larger than the corresponding slice level, that is, the change from C≦D to C>D (step 823) takes place, the control/timing generating circuit 114, in response to the signal from the digital comparator 106 to that effect, instructs that the count (T71, FIG. 3C) of the timing clock pulses of the counter circuit 119 be written in the memory 121 (step 833). Thus, the time of the signal S71 detected is stored in the zero address of the memory 121. Simultaneously, the address counter for the memory 109 in the control/timing generating circuit 114 and the address counter for the memory 121 are each incremented by one. When the alignment mark detection signal S72 is inputted the datum (C) of the detection signal S72 is compared with the slice level D determined for the detection signal S72 and stored in the address "1" of the memory 109, since the address counter for the memory 109 has been incremented to the address "1". When the datum of signal S72 becomes larger than the corresponding slice level, that is, the change from C≦D to C>D takes place, a memory writing signal is produced so that the count of the counter circuit 119 at this time is written in the address "1" of the memory 121 (the address counter for the memory 121 has been incremented to "1"). Thus, the counts of the clock pulses corresponding to the times at which the signals S71, S72 . . . are detected, are stored at the predetermined addresses. Upon the termination of the synchronization signal 101, an end signal is sent from the control/timing generating circuit 114 to the microprocessor, so that the second measurement ends (step 836).

Referring back again to FIG. 5, the end of the measurement is detected at step 510, and at step 511 the microprocessor selects the memory 121 to read the data thereof.

In this manner, the intervals between the marks T75-T71, T72-T75, . . . which are shown in FIG. 3 is measured. In this embodiment, only the state change from $C \leqq D$ to $C > D$ is detected, but it is possible that the change from $C > D$ to $C \leqq D$ is also detected, and the mark position is determined as the center of the two changes, that is, the count $(T71-T71')/2$, for example.

According to the present invention, as described above, even if there are differences between the peak levels of the detected signals due to the materials of the base plate on which the marks are formed, the possible overlooking of the marks can be positively prevented, since the slice levels are automatically determined for the respective peak signals.

The first and the second measurements have been described as being executed under the control of the control/timing generating circuit 114 without the use of the microcomputer. The major reason for this is that the comparison and the memory writing should be effected at a high speed. However, the present invention is not limited to such a hardware circuit. A high speed processor of a pipe line control type may be used.

Also, it is possible that the levels of the serial output signals of the photodetectors 47 and 47' are digitalized and once stored in a memory, and then read out after the slice levels are determined, whereafter the stored levels are compared with the slice levels.

While the invention has been described with reference to the structures disclosed herein, it is not confined to the details set forth and this application is intended to cover such modifications or changes as may come within the purposes of the improvements or the scope of the following claims.

What is claimed is:

1. A measurement apparatus, comprising:
   detecting means for detecting a mark on each of a plurality of objects and for producing a signal having a peak value in response to the detection of each of the marks, so as to form a series of signals;
   peak detecting means for detecting the peak values of the signals;
   means for determining a slice level for each of the peak values detected by said peak detecting means; and
   means for sequentially comparing the signals with their respective slive levels, as determined by said slice level determining means, and for determining an interval between the marks on the basis of the comparison.

2. An apparatus according to claim 1, wherein the detecting means is adapted to detect a plurality of marks on a mask having an integrated circuit pattern and a plurality of marks on a wafer.

3. An apparatus according to claim 1, further comprising means for aligning the objects in accordance with the interval determined by said comparing means.

* * * * *

UNITED STATES PATENT AND TRADEMARK OFFICE
CERTIFICATE OF CORRECTION

PATENT NO. : 4,641,257

DATED : February 3, 1987

INVENTOR(S) : NAOKI AYATA

It is certified that error appears in the above-identified patent and that said Letters Patent is hereby corrected as shown below:

COLUMN 10

Line 22, "slive" should read -- slice --.

Signed and Sealed this

Twenty-second Day of September, 1987

Attest:

DONALD J. QUIGG

*Attesting Officer*      *Commissioner of Patents and Trademarks*